United States Patent
Ge

(10) Patent No.: US 6,559,686 B1
(45) Date of Patent: May 6, 2003

(54) ANALOG ENVELOPE DETECTOR

(75) Inventor: Yongmin Ge, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 76 days.

(21) Appl. No.: 09/650,133

(22) Filed: Aug. 29, 2000

(65) Prior Publication Data (65)

Related U.S. Application Data

(60) Provisional application No. 60/203,679, filed on May 12, 2000.

(51) Int. Cl.[7] .......................... G01R 19/00; H03K 5/22
(52) U.S. Cl. ........................... 327/62; 327/65; 327/77
(58) Field of Search .................... 327/52–56, 58–62, 327/63, 65–67, 77, 78, 79, 89, 560–563, 350–353; 330/252, 253, 258, 261

(56) References Cited

U.S. PATENT DOCUMENTS

| 5,130,666 | A | * | 7/1992 | Nicollini | 330/253 |
| 5,355,094 | A | * | 10/1994 | Soda | 327/65 |
| 5,606,272 | A | * | 2/1997 | Behbahani et al. | 327/333 |
| 5,933,056 | A | * | 8/1999 | Rothenberg | 330/252 |
| 6,278,299 | B1 | * | 8/2001 | Madni et al. | 327/103 |

OTHER PUBLICATIONS

Universal Ser. Bus Specification, Revision 2.0, Apr. 27, 2000, pp. 1–622.

* cited by examiner

*Primary Examiner*—Toan Tran
(74) *Attorney, Agent, or Firm*—Christopher P. Maiorana, P.C.

(57) ABSTRACT

A circuit configured to (i) receive a differential signal pair and (ii) generate one or more common mode signals. The circuit generally provides a large impedance on each input line.

18 Claims, 3 Drawing Sheets

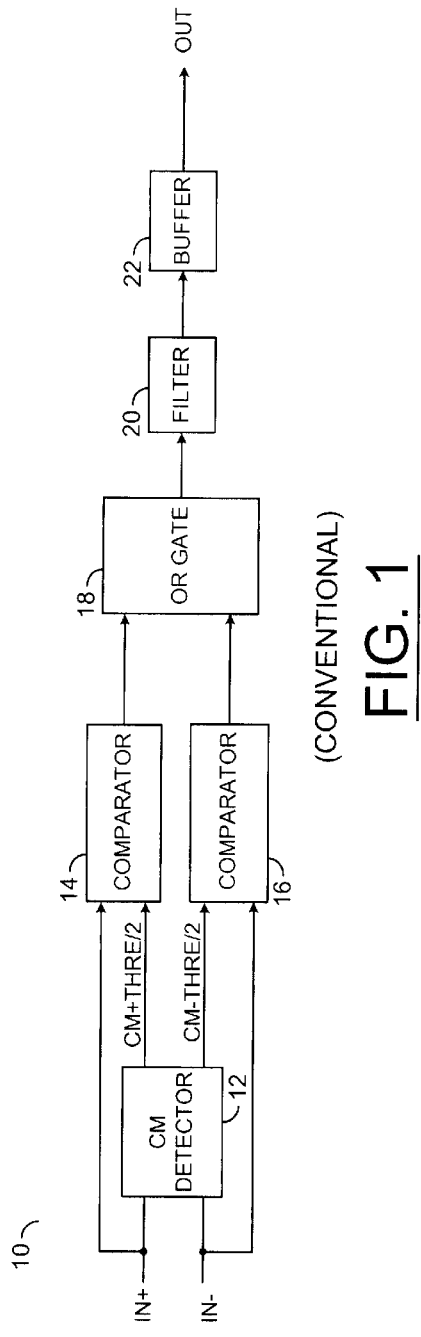
FIG. 1
(CONVENTIONAL)
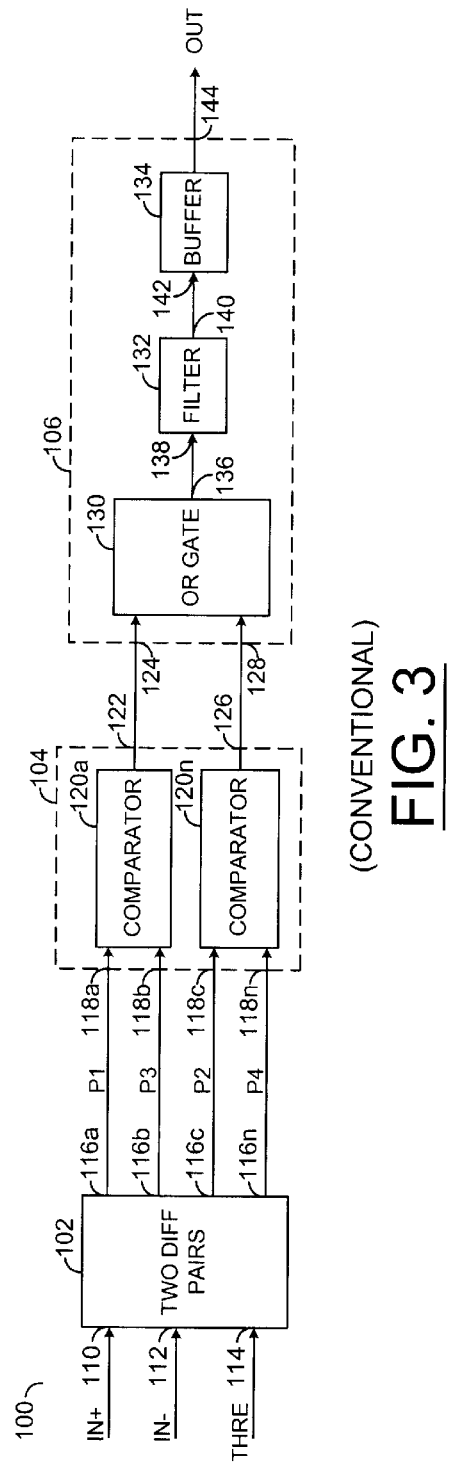
FIG. 3
(CONVENTIONAL)

ANALOG ENVELOPE DETECTOR

This application claims the benefit of U.S. Provisional Application No. 60/203,679, filed May 12, 2000 and is hereby incorporated by reference in its entirety.

FIELD OF THE INVENTION

The present invention relates to a method and/or architecture for an analog envelope detector generally and, more particularly, to a method and/or architecture for detection of a modulated sinusoid wave with random phase in the presence of additive white Gausian noise.

BACKGROUND OF THE INVENTION

Referring to FIG. 1, a system 10 is shown implementing a conventional analog envelope detector. An analog envelope detector can be implemented to detect a modulated sinusoid wave with random phase in the presence of white Gausian noise. The system 10 generally comprises a common mode detector circuit 12, a comparator 14, a comparator 16, an OR gate 18, a filter 20 and a buffer 22. A first input signal IN+ is presented to a first input of the common mode detector circuit 12 and a first input of the comparator 14. A second input signal IN- is presented to a second input of the common mode detector circuit 12 and a first input of the comparator circuit 16. The common mode detector circuit 12 presents a signal CM+THRE/2 to a second input of the comparator 14 and a signal CM-THRE/2 to a second input of the comparator 16. The common mode detector 12 is configured to determine the common mode voltage CM. The comparator 14 presents an output to a first input of the OR gate 18. Similarly, the comparator 16 presents a signal to a second input of the OR gate 18. The OR gate 18 presents a signal to the filter 20 which presents a signal to the buffer 22. The buffer 22 presents a signal OUT.

Referring to FIG. 2, a detailed diagram of the comparator 14 is shown. The comparator 14 comprises a number of resistors RL1–RL2 and a number of transistors Q1 and Q2. Each of the resistors RL1–RL2 is coupled to a power supply VPWR and the transistors Q1 and Q2, respectively. The comparator 14 also comprises a current source I. Emitters of the transistors Q1 and Q2 are coupled to the current source I. The current source I is also coupled to ground. The transistors Q1 and Q2 are configured as a differential pair. The transistor Q1 is controlled by a signal INPUT+ and is configured to control a voltage level of a node OUT-. The transistor Q2 is controlled by a signal INPUT- and is configured to control a voltage level of a node OUT+.

In the conventional design shown in FIGS. 1 and 2, the common mode detector 12 internally calculates a common mode voltage (i.e., CM) of the input signals IN+ and IN-. The common mode voltage CM and a threshold voltage (i.e., THRE) are used by the detector 12 to present the signals CM+THRE/2 and CM-THRE/2, which are DC threshold signals. The comparators 14 and 16 then perform a comparison between the two DC outputs CM+THRE/2 and CM-THRE/2 and the two differential inputs IN+ and IN-.

Such conventional designs implement a small input impedance. Additionally, since the conventional design of FIGS. 1 and 2 implements NPN differential pair transistors (i.e., the transistors Q1 and Q2), the conventional design is not capable of operating when a voltage of the input signals IN+ and IN- is close to ground level.

It is therefore desirable to provide an analog envelope detector that may (i) detect an amplitude of an input data, (ii) increase an input impedance and/or (iii) be implemented without a common mode detector.

SUMMARY OF THE INVENTION

The present invention concerns a circuit configured to (i) receive a differential signal pair and a threshold signal and (ii) generate one or more common mode signals. The circuit generally provides a large impedance on each input line.

The objects, features and advantages of the present invention include providing a method and/or architecture for an analog envelope detector that may (i) detect an amplitude of an input data, (ii) increase an input impedance and/or (iii) be implemented without a common mode detector.

BRIEF DESCRIPTION OF THE DRAWINGS

These and other objects, features and advantages of the present invention will be apparent from the following detailed description and the appended claims and drawings in which:

FIG. 1 is a block diagram of a conventional common mode detector circuit;

FIG. 3 is a block diagram of a preferred embodiment of the present invention;

DETAILED DESCRIPTION OF THE PREFERRED EMBODIMENTS

Figure 2:
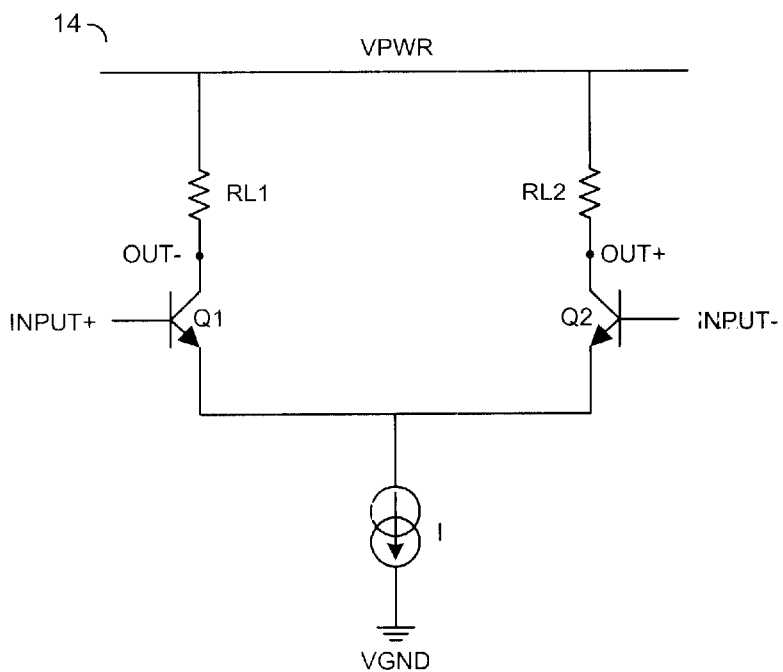
FIG. 2 is a schematic of a conventional comparator circuit of FIG. 1.

Referring to FIG. 3, a block diagram of a circuit 100 is shown in accordance with a preferred embodiment of the present invention. The circuit 100 may be implemented, in one example, as an analog envelope detector. The circuit 100 may be implemented to detect a modulated sinusoidal wave with random phase in the presence of white Gausian noise. The circuit 100 generally comprises an input section (or circuit) 102, a comparator section (or circuit) 104 and an output section (or circuit) 106.

The input section 102 may be implemented, in one example, as two differential transistor pairs (to be described in more detail in connection with FIG. 4). The input section 102 may have an input 110 that may receive a signal (e.g., IN+), an input 112 that may receive a signal (e.g., IN-) and an input 114 that may receive a signal (e.g., THRE). In one example, the signals IN+ and IN- may be implemented as a differential pair. Additionally, the signal THRE may be implemented as a threshold signal. For example, the signal THRE may represent a threshold voltage of a particular transistor type. However, the signals IN+, IN- and THRE may be implemented as data signals, address signals or other appropriate type signals in order to meet the criteria of a particular implementation.

The input section 102 may have a number of outputs 116a–116n that may present a number of signals (e.g., P1, P2, P3 and P4). For example, the output signal P1 may be presented by the output 116a, the output signal P3 may be presented by the output 116b, the output signal P2 may be presented by the output 116c and the output signal P4 may be presented by the output 116n. In one example, the signals P1–P4 may represent common mode signals. However, the signals P1–P4 may be implemented as other appropriate type signals in order to meet the criteria of a particular implementation. The output signals P1–P4 may be presented to a number of inputs 118a–118n of the comparator section 104. A particular voltage of the common mode signals P1–P4 may be determined by a predetermined design parameter of the input section 102 (to be discussed further in connection with FIG. 4).

The comparator section 104 generally comprises a number of comparators 120a–120n. In a preferred implementation, the comparator section 104 may implement two comparators. However, a particular number of comparators may be varied in order to meet the criteria of a particular implementation. The comparator 120a may receive the signal P1 and the signal P3. The comparator 120b may receive the signal P2 and the signal P4. The comparator 120a may have an output 122 that may present a signal that may be received at an input 124 of the output section 106. Similarly, the comparator 120n may have an output 126 that may present a signal that may be received at an input 128 of the output section 106.

The output section 106 generally comprises a gate section 130, a filter section 132 and a buffer section 134. The gate section 130 may be implemented, in one example, as an OR gate. However, other similar type logic gates may be substituted accordingly to meet the design criteria of a particular implementation. The OR gate 130 may be implemented to sum a period when the signal pair P1/P2 may have a larger amplitude than the signal pair P3/P4 for a particular cycle length. The gate section 130 may have an output 136 that may present a signal to an input 138 of the filter section 132. The filter section 132 may have an output 140 that may present a signal to an input 142 of the buffer section 134. The buffer section 134 may present a signal (e.g., OUT) to an output 144 of the output section 106.

Figure 4:
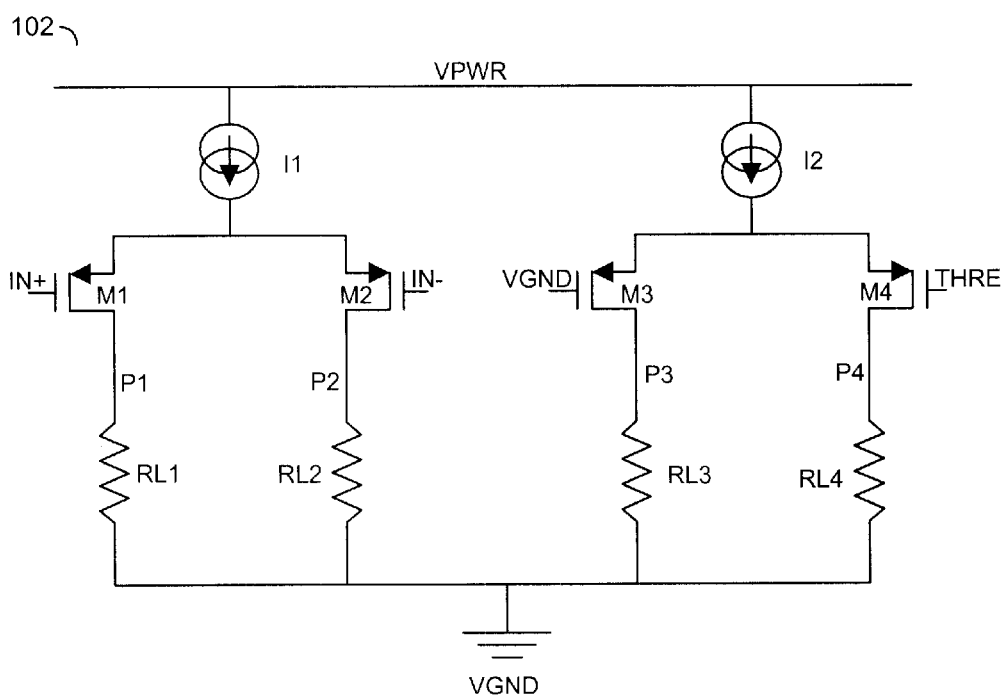
FIG. 4 is a schematic of a differential pair circuit of FIG. 3.

Referring to FIG. 4, a more detailed diagram of the circuit 102 is shown. The circuit 102 is shown comprising a current source I1, a current source I2, a transistor M1, a transistor M2, a transistor M3, a transistor M4, a resistor RL1, a resistor RL2, a resistor RL3 and a resistor RL4. The transistors M1 and M2 may form a first transistor pair. The transistors M3 and M4 may form a second transistor pair. A gate of the transistor M1 generally receives the signal IN+. A gate of the transistor M2 generally receives the signal IN–. A gate of the transistor M3 generally receives a ground voltage VGND. A gate of the transistor M4 generally receives the threshold voltage THRE from the input 114. Sources of the transistor pair M1/M2 may be coupled to the current source I1. Sources of the transistor pair M3/M4 may be coupled to the current source I2. The resistors RL1–RL4 are generally connected between the transistor pairs M1/M2 and M3/M4 and a ground voltage VGND, respectively. A drain of the transistor M1 generally presents the signal P1, a drain of the transistor M2 generally presents the signal P2, a drain of the transistor M3 generally presents the signal P3 and a drain of the transistor M4 generally presents the signal P4.

A common mode of the signals P1–P4 may be determined by a resistance value of the resistors RL1–RL4 and the current sources I1 and I2. The common mode of the signals P1–P4 may be determined as I/2*R, where I is the current through the current source I1 and/or I2 and R is the resistive value of a particular resistor RL1–RL4. Additionally, the current source I1 is generally equivalent to the current source I2 (I1=I2) and the resistors RL1–RL4 may have an equivalent resistance value (RL1=RL2=RL3=RL4).

The circuit 100 generally detects an amplitude of a signal (e.g., the signals IN+ and IN–). If the amplitude is larger than a predetermined criteria (e.g., a threshold voltage) then a voltage of the signal OUT is generally set to a logic low (e.g., "0"). If the amplitude is smaller than a predetermined criteria (e.g, a threshold voltage) then a voltage of the signal OUT is generally set to a logic high (e.g., "1").

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The circuit 100 may be implemented without a common mode detector, as discussed in the background section of the present application. The two differential transistor pair circuit 102 may cascade current sources (e.g., the current source I1 and the current source I2) to maintain high common mode rejection ratio. The circuit 100 may implement the two differential transistor pairs (M1/M2 and M3/M4) as NMOS devices. However, the transistor pairs M1/M2 and M3/M4 may be implemented as another appropriate type device in order to meet the criteria of a particular implementation. The transistor pair M1/M2 may depend on a voltage level of input signals IN+ and IN–. The bias (e.g., VGND and THRE) may not fully turn off the transistor pair M3/M4 when the threshold voltage THRE is applied. Additionally, the differential transistor pair M3/M4 may operate in the linear region.

Figure 5:
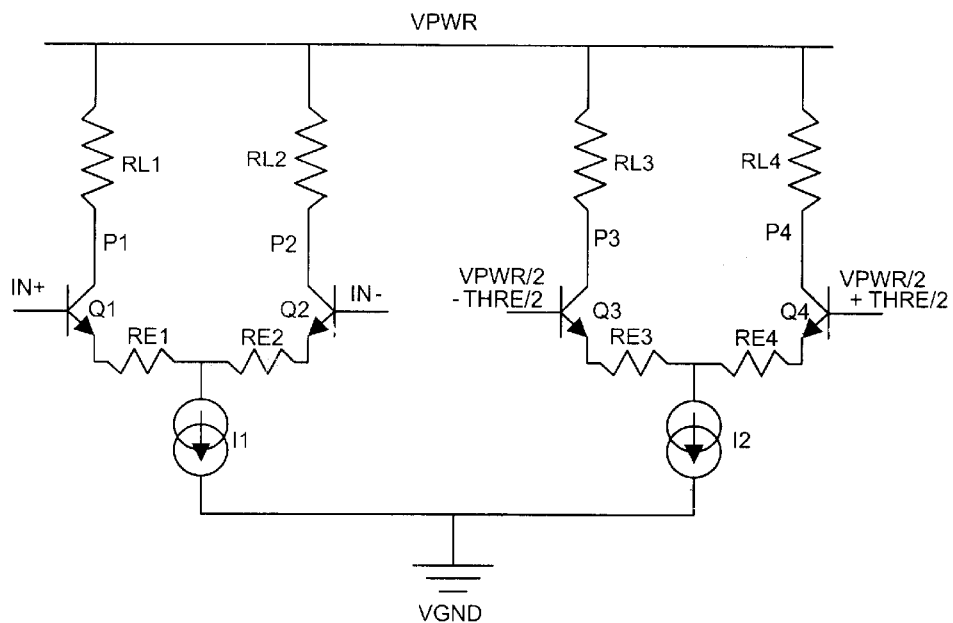
FIG. 5 is a schematic of an alternate embodiment of the present invention.

Referring to FIG. 5, a circuit 150 is shown. The circuit 150 may be somewhat similar to the circuit 14 of the background section. However, the circuit 150 may have several improvements. The circuit 150 may implement the differential transistor pairs shown in FIG. 2. However, a number of resistors RE1–RE4 may be added to improve the circuit.

The circuit 150 generally comprises a number of transistors Q1, Q2, Q3, Q4, a current source I1, a current source I2, a number of resistors RL1, RL2, RL3 and RL4 and the number of resistors RE1, RE2, RE3 and RE4. The transistors Q1 and Q2 are generally implemented as a first differential pair. The transistors Q3 and Q4 are generally implemented as a second differential pair. The transistors Q1 and Q2 generally receive the input signals IN+ and IN–. The transistor pair Q3 and Q4 generally receive the signal VPWR/2–THRE/2 and the signal VPWR/2+ THRE/2.

The improved design of circuit 150 may have larger input impedance, (e.g., 10 thousand Ohms). Also the bias may not turn off transistor Q3 or Q4 when the threshold voltage THRE is applied. The circuit 150 may be implemented for the input signals IN– and IN+ with a common mode voltage larger than 1.5 V.

Figure 6:
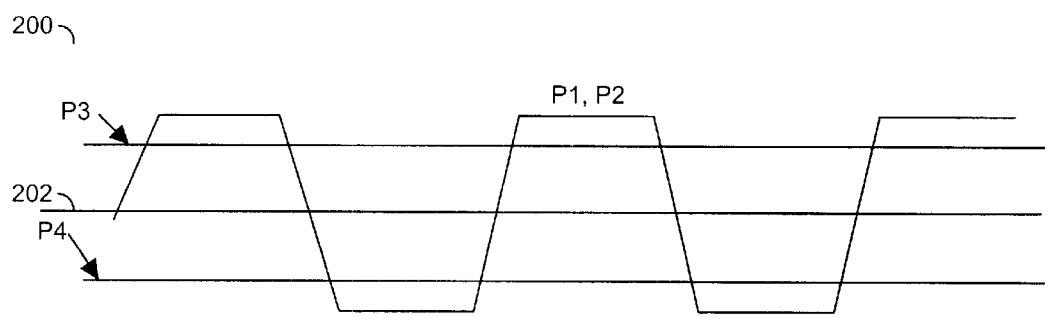
FIG. 6 is a graph illustrating an operation of the present invention.

Referring to FIG. 6 a timing diagram 200 is shown illustrating internal modes of the present invention. The timing diagram 200 may illustrate the operation of the common mode signals P1–P4. The timing diagram 200 may illustrate a waveform of a number of internal modes of the present invention. The timing diagram 200 may illustrate two periods of the waveforms pf the signals P1,P2,P3 and P4. The signals P1, P2, P3 and P4 may represent common mode signals.

The signal pair P3/P4 may be implemented as common mode outputs of the DC inputs of the voltage VGND and the voltage THRE. The signal pair P1/P2 may be implemented as common mode outputs of the AC inputs IN+ and IN–. Additionally, a line 202 may represent a common mode of the signal pairs P1/P2 and P3/P4 (e.g., I/2*R).

The circuit 100 may provide a large input impedance. For example, the circuit 100 may provide an impedance of 300 thousand Ohms (or larger) for input signals with voltage levels close to ground. Such high impedances are useful in devices in accordance with the Universal Serial Bus (USB) Specification, Version 2.0, (published April 2000 and hereby incorporated by reference in its entirety). The circuit 100 may implement differential transistor pairs with NMOS transistors to allow for the input signals IN− and IN+ to be close to power and/or ground. The circuit 100 may implement two differential transistor pairs for the first stage of an envelope detector. The circuit 100 may increase an input impedance by not implementing the common-mode detector.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first differential transistor pair configured to generate a first and a second common mode signal in response to a differential input signal; and a second differential transistor pair configured to generate a third and a fourth common mode signal in response to a threshold signal;

a first comparator configured to generate a first compare signal in response to said first and said third common mode signal; and a second comparator configured to generate a second compare signal in response to said second and said fourth common mode signals.

2. The apparatus according to claim 1, wherein said apparatus is configured to allow a voltage close to ground on the differential input signal.

3. The apparatus according to claim 1, wherein said apparatus is configured to allow a voltage close to power on the differential input signal.

4. The apparatus according to claim 1, wherein said apparatus comprises a first current source and a second current source.

5. The apparatus according to claim 1, wherein:

said first differential transistor pair is coupled to a first current source; and said second differential transistor pair is coupled to a second current source.

6. The apparatus according to claim 5, wherein said apparatus further comprises one or more resistors coupled to said first and second differential transistor pairs.

7. The apparatus according to claim 5, wherein said second differential transistor pair is configured to operate in a linear region.

8. The apparatus according to claim 1, wherein said apparatus is further configured to provide high common mode rejection ratio of said common mode signals.

9. The apparatus according to claim 1, wherein said first and second differential transistor pairs comprise NMOS type transistors.

10. The apparatus according to claim 1, wherein said first differential transistor pair is dependent upon a particular voltage level of said differential input signal.

11. The apparatus according to claim 1, wherein said threshold signal comprises a threshold voltage.

12. An apparatus comprising:

means for generating a first and a second common mode signals in response to a differential signal;

means for generating a third and a fourth common mode signal in response to a threshold signal;

means for generating a first compare signal in response to said first and said third common mode signals; and means for generating a second compare signal in response to said second and fourth common mode signals.

13. A method for detecting an amplitude of a differential signal, comprising the steps of:

(A) generating a first and second common mode signal in response to said differential signal; and (B) generating a third and fourth common mode signal in response to a threshold signal;

(C) generating a first compare signal in response to said first and said third common mode signals; and (D) generating a second compare signal in response to said second and fourth common mode signals.

14. The method according to claim 13, wherein step (A) further comprises:

generating said first and second common mode signals with a first differential transistor pair; and generating said third and fourth common mode signals with a second differential transistor pair.

15. The apparatus according to claim 1, wherein said apparatus further comprises one or more resistors configured to provide an impedance on each input line greater than 300 K-ohms.

16. The apparatus according to claim 1, further comprising:

an output circuit configured to generate an output signal in response to said first and second compare signals.

17. The method according to claim 13, further comprising the step of:

generating an output signal in response to said first and said second compare signals.

18. The method according to claim 17, wherein said output signal determines if said amplitude of said differential signal is above said threshold signal.

* * * * *